US011515686B1

(12) United States Patent
Lyakh et al.

(10) Patent No.: US 11,515,686 B1
(45) Date of Patent: Nov. 29, 2022

(54) METHOD OF MAKING QCL WITH OPTIMIZED BRIGHTNESS AND RELATED METHODS

(71) Applicant: UNIVERSITY OF CENTRAL FLORIDA RESEARCH FOUNDATION, INC., Orlando, FL (US)

(72) Inventors: Arkadiy Lyakh, Oviedo, FL (US); Matthew Suttinger, Orlando, FL (US)

(73) Assignee: UNIVERSITY OF CENTRAL FLORIDA RESEARCH FOUNDATION, INC., Orlando, FL (US)

(*) Notice: Subject to any disclaimer, the term of this patent is extended or adjusted under 35 U.S.C. 154(b) by 394 days.

(21) Appl. No.: 16/871,270

(22) Filed: May 11, 2020

Related U.S. Application Data

(60) Provisional application No. 62/847,479, filed on May 14, 2019.

(51) Int. Cl.
*H01S 5/34* (2006.01)
*H01S 5/06* (2006.01)
*B82Y 20/00* (2011.01)

(52) U.S. Cl.
CPC .......... *H01S 5/3401* (2013.01); *H01S 5/0612* (2013.01); *B82Y 20/00* (2013.01)

(58) Field of Classification Search
USPC ........................................................ 372/50.1
See application file for complete search history.

(56) References Cited

U.S. PATENT DOCUMENTS

| | | | |
|---|---|---|---|
| 8,014,430 B2 | 9/2011 | Patel et al. | |
| 8,068,524 B1 | 11/2011 | Patel et al. | |
| 8,121,164 B1 | 2/2012 | Lyakh et al. | |
| 9,077,153 B2 | 7/2015 | Maulini et al. | |
| 9,917,418 B2* | 3/2018 | Razeghi | H01S 5/4037 |
| 10,020,635 B1 | 7/2018 | Lyakh | |
| 10,177,535 B1 | 1/2019 | Lyakh | |
| 10,355,449 B2 | 7/2019 | Lyakh | |
| 10,615,562 B2 | 4/2020 | Patel et al. | |
| 10,673,209 B2 | 6/2020 | Lyakh et al. | |
| 2013/0010823 A1 | 1/2013 | Maulini et al. | |
| 2015/0249319 A1* | 9/2015 | Caneau | H01S 5/2031 372/45.01 |
| 2016/0322788 A1 | 11/2016 | Lyakh et al. | |
| 2018/0254603 A1 | 9/2018 | Patel et al. | |
| 2019/0199066 A1 | 6/2019 | Lyakh et al. | |

OTHER PUBLICATIONS

Federico Capasso "High-performance midinfrared quantum cascade lasers" Optical Engineering 49(11), 111102 (Nov. 2010); pp. 9.

* cited by examiner

*Primary Examiner* — Tuan N Nguyen
(74) *Attorney, Agent, or Firm* — Allen, Dyer, Doppelt + Gilchrist, PA

(57) ABSTRACT

A method is for making a QCL having an InP spacer within a laser core, the QCL to provide a CW output in a high quality beam. The method may include selectively setting parameters for the QCL. The parameters may include a number of the InP spacer, a thickness for each InP spacer, a number of stages in the laser core, and a dopant concentration value in the laser core. The method may include forming the QCL based upon the parameters so that a figure of merit comprises a greatest value for a fundamental mode of operation for the QCL.

20 Claims, 18 Drawing Sheets

METHOD OF MAKING QCL WITH OPTIMIZED BRIGHTNESS AND RELATED METHODS

GOVERNMENT RIGHTS

This invention was made with government support under Grant Number N00014-16-12424 awarded by the Office of Naval Research. The government has certain rights in the invention.

RELATED APPLICATION

This application is based upon prior filed Application No. 62/847,479 filed May 14, 2019, the entire subject matter of which is incorporated herein by reference in its entirety.

TECHNICAL FIELD

The present disclosure relates to lasers and, in particular, to quantum cascade laser and related methods.

BACKGROUND

Quantum cascade lasers (QCLs) differ from traditional semiconductor diode lasers in that they do not use a p-n junction for light emission. Multiple active regions are "cascaded" so that each injected electron can emit multiple photons and therefore enhance laser gain. Each active region includes a multi-layered semiconductor material structure. This multi-layered semiconductor material structure is designed to have an electronic band structure that gives the desired emission wavelength, and is manufactured with nanometer-level thickness control.

Most commercially available QCLs are of the "edge-emitting" variety. In these approaches, linear ridges are created by etching vertically through the layered structure, which has been grown on a wafer substrate. These are cleaved so that the active region comprises a rectangular ridge several millimeters in length, which forms a waveguide. The laser radiation is amplified by passing back and forth along the axis of the ridge. Laser emission occurs on the end facets of these ridges.

SUMMARY

Generally, a method is for making a QCL having at least one InP spacer within a laser core. The QCL is to provide a continuous wave (CW) output. The method may comprise selectively setting a plurality of parameters for the QCL. The plurality of parameters may include a number of the at least one InP spacer, a thickness for each InP spacer, a number of stages in the laser core, and a dopant concentration value in the laser core. The method may comprise forming the QCL based upon the plurality of parameters so that a figure of merit comprises a greatest value for a fundamental mode of operation for the QCL. In particular, the plurality of parameters may comprise a number of spaced apart active region stacks in the laser core.

In some embodiments, the spaced apart active region stacks may comprise outer active region stacks and inner active region stacks. The inner active region stacks may have a different number of layers than the outer active region stacks. The QCL may comprise one of a buried heterostructure (BH) configuration or a ridge waveguide (RWG) configuration.

Also, the method may further comprise determining a threshold current value during the CW output based upon a threshold current value during pulsed output and an ambient temperature value. The method may further comprise forming a highly reflective (HR) coatings on a back facet of the QCL. The method may further comprise forming the laser core to have a width greater than 20 µm.

The method may further comprise forming the QCL to have a double channel configuration, and forming trenches adjacent a central ridge with a thermally conductive material. The plurality of parameters may comprise a transparency current value, loss values, a differential gain value, an injection efficiency value, and a sub-linearity of a pulsed power versus current density value.

Another aspect is directed to a method for predicting performance of a QCL having at least one InP spacer within a laser core. The QCL is to provide a CW output. The method may include selectively setting a plurality of parameters for the QCL. The plurality of parameters may include a number of the at least one InP spacer, a thickness for each InP spacer, a number of stages in the laser core, and a dopant concentration value in the laser core. The method may also include generating a figure of merit comprising a greatest value for a fundamental mode of operation for the QCL based upon the plurality of parameters.

Yet another aspect is directed to a QCL comprising a substrate, and a laser core over the substrate. The laser core may include a plurality of active region stacks. Each region stack may include a plurality of active region layers, and at least one InP spacer between respective ones of the plurality of active region stacks. The QCL may include semiconductor layers adjacent to the laser core and guiding a laser mode into the laser core.

DETAILED DESCRIPTION

The present disclosure will now be described more fully hereinafter with reference to the accompanying drawings, in which several embodiments of the invention are shown. This present disclosure may, however, be embodied in many different forms and should not be construed as limited to the embodiments set forth herein. Rather, these embodiments are provided so that this disclosure will be thorough and complete, and will fully convey the scope of the present disclosure to those skilled in the art. Like numbers refer to like elements throughout.

In this disclosure, a quantum cascade laser configuration is described, and is capable of producing multi-watt CW optical power with a high beam quality both in the narrow-ridge and broad-ridge configurations.

Broad-Area Configuration for CW Power Scaling

An analysis of the temperature gradient of a broad area QCL (ridge width >10 μm) in a one dimensional model has demonstrated [2] that devices with a reduced number of stages can be engineered to keep active region temperature within a range that allows for CW operation and power scaling. The present Applicant subsequently demonstrated first CW power scaling for broad-area QCLs. A 15-stage QCL material with active region and waveguide designs discussed in [1] was grown with molecular beam epitaxy and the processed into then standard buried heterostructure (BH) configuration. The processed wafer was subsequently cleaved into 3.15 mm-long chips with various ridge widths. The chips were mounted on aluminum nitride submounts, epi-down to reduce laser thermal resistance.

Figure 2:
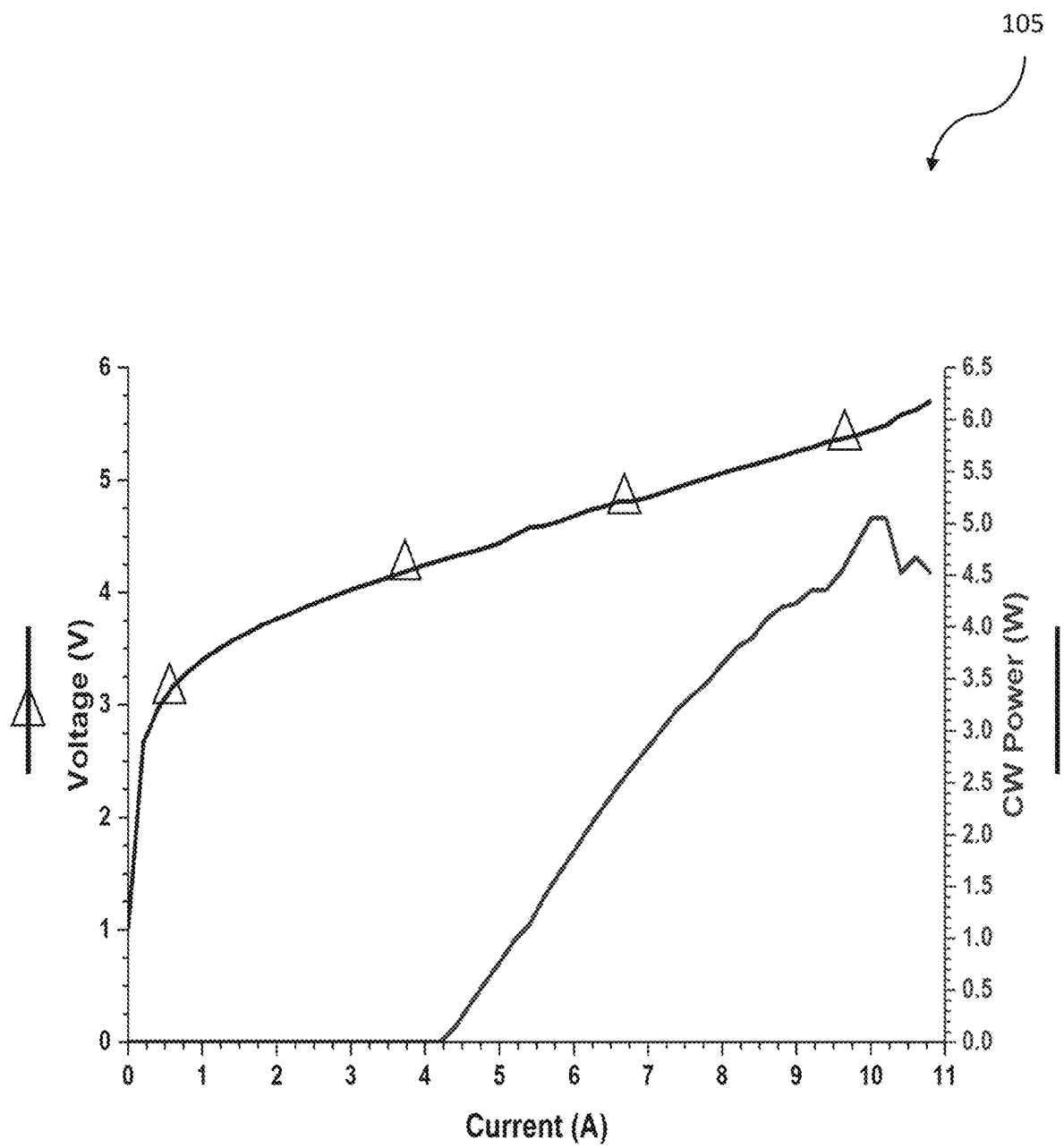
FIG. 2 is a diagram of CW Light-Power-Voltage curve for the 5.7 µm emitting QCL with 15-stages (Laser dimensions are 6.3 mm×21.2 µm), according to the present disclosure.

The devices were then tested in CW operation on a thermoelectric cooler set to 20° C. The 10.4 μm, 21.2 μm, and 31.0 μm wide active region devices had threshold currents of 1.12 amps, 2.40 amps, and 3.85 amps, with maximum powers at thermal rollover of 1.62 W, 2.34 W, and 1.70 W, respectively. The CW optical power increase from 1.62 W to 2.34 W for ridge width increase from 10 μm to 20 μm was the first demonstration of CW optical power scaling in the broad area configuration. It is a direct consequence of a reduced thermal resistance for QCLs with a reduced number of stages: calculated thermal resistance for a 21.2 μm-wide, 15-stage QCL with the base design is 3.4 K/W versus 4.7 K/W for the 40-stage design. The results of the CW measurements are shown in diagram 105 of FIG. 2, also overlaid with simulation results to be discussed later in the text.

The ability to predict CW performance for a QCL configuration that is based on a given active region stage design can serve as a tool for the QCL performance optimization without the need to fabricate and test each proposed device. Simulation of QCL characteristics from first principles is a very complex and computationally intensive problem. A simpler model predicting CW power for various device geometries based on a known active region design can be constructed using experimental pulsed data for the given design. The simple semi-empirical model developed by the present Applicant uses the measured values for transparency current, losses, differential gain, injection efficiency, and sub-linearity of a pulsed power versus current density (LI) characteristic as input model parameters to project pulsed LI characteristics for devices with an arbitrary configuration but the same layer sequence in the stage (variable cavity length, number of stages, doping, ridge width, etc.).

A COMSOL (i.e. COMSOL Multiphysics, as available from COMSOL Inc. of Stockholm, Sweden) waveguide simulation is used to account for changing mode overlap factor with the active region (Γ) for devices with different number of stages. The model is subsequently linked to a COMSOL thermal simulation to take into account active region self-heating in CW mode and to project CW LI characteristics.

When in pulsed operation, a QCL will reach a threshold current defined by the properties of its quantum well structure and the geometry of the waveguide:

$$I_{th,pulse} = wL\left(J_{tr} + \frac{\alpha_M + \alpha_{WG}}{\Gamma g}\right) \quad (1)$$

where active region width is defined as w, device length is defined as L, mirror loss is defined as $\alpha_M$, waveguide loss is defined as $\alpha_{WG}$, and differential gain is defined as g.

Near threshold, pulsed power scales linearly with current. This linear relationship is defined by the slope efficiency, the additional power gained per unit current:

$$\eta_{S,pulse} = N_s\left(\frac{hc}{\lambda q_e}\right)\left(\frac{\alpha_M}{\alpha_M + \alpha_{WG}}\right)\left(\frac{1}{1 + \tau_3/\tau_4}\right)\eta_i \quad (2)$$

The terms in Equation 2 are as follows: number of active region stages, $N_s$, wavelength, $\lambda$, lower laser lifetime, $\tau_3$, upper laser lifetime, $\tau_4$, and injection efficiency, Slope efficiency has a sub-linear dependence at high bias as injection efficiency for the upper laser level reduces. A rigorous theoretical treatment for injection efficiency would needlessly complicate the model, so an envelope is applied to the LI curve to replicate the curvature of the experimental results. This is done with a parametrization of LI characteristic for a given design at large bias.

The portion of the semi-empirical model discussed above is sufficient to project LI characteristics for devices with a given active region stage design in different configurations. Because short pulses (100s of nanoseconds) and low enough duty cycle prevent temperature build up in the active region, the active region is taken to be at a fixed temperature for modeling pulsed laser characteristics. However, CW operation allows for continual buildup of heat that both increases threshold current and decreases slope efficiency at threshold. This thermal behavior is typically described with characteristic temperatures $T_0$ and $T_1$:

$$I_{th,cw} = I_{th,pulse} e^{\frac{T-T_i}{T_0}} \quad (3)$$

$$\frac{\partial P}{\partial I} = \eta_{S,pulse} e^{\frac{T-T_i}{T_1}} \quad (4)$$

The terms in Equations 3 and 4 are as follows: CW threshold current, $I_{th,cw}$, the current dependent component of CW slope efficiency, $$\frac{\partial P}{\partial I},$$

the ambient temperature without heat buildup (i.e., the temperature set by a thermoelectric controller) $T_i$, characteristic temperature for threshold current density (taken from experiment) $T_0$, and characteristic temperature for slope efficiency (taken from experiment) $T_1$.

A projection of CW power above threshold requires consideration for thermal effects. By introducing a temperature varying with current, the derivative of power with respect to current is redefined:

$$\frac{dP}{dI} = \frac{\partial P}{\partial I} + \frac{\partial P}{\partial T}\frac{\partial T}{\partial I} \quad (5)$$

The first term is taken as the partial derivative with respect to current at threshold as defined in Equation 4. For the second term, partial derivative of temperature with respect to current is taken from COMSOL thermal simulations and $$\frac{\partial P}{\partial T}$$

is found as:

$$\frac{\partial P}{\partial T} = \frac{\partial}{\partial T}\left[\frac{\partial P}{\partial I} * (I - I_{th,cw}(T))\right] \quad (6)$$

In the thermal simulation, a linear model on current density approximates the linear portion of the voltage for the device. The linear model is given by a voltage offset, $V_0$, and a differential resistance, $R_d$, that scale with number of stages. Electrical power is deposited in the active region as the product of voltage and current, where the voltage is taken as:

$$V = N_s(V_0 + JR_d) \quad (7)$$

The active region is assigned a cross plane thermal conductivity, $k_\perp$, and an in plane thermal conductivity, $k_\parallel$. A stationary solution is found where the mean temperature in the active region is taken to be T. For projections involving a change in the active region doping, it was assumed that transparency current (defined by backscattering), roll-over current density, and losses originating from the active region (non-resonant intersubband losses) are all directly proportional to doping level.

Figure 1:
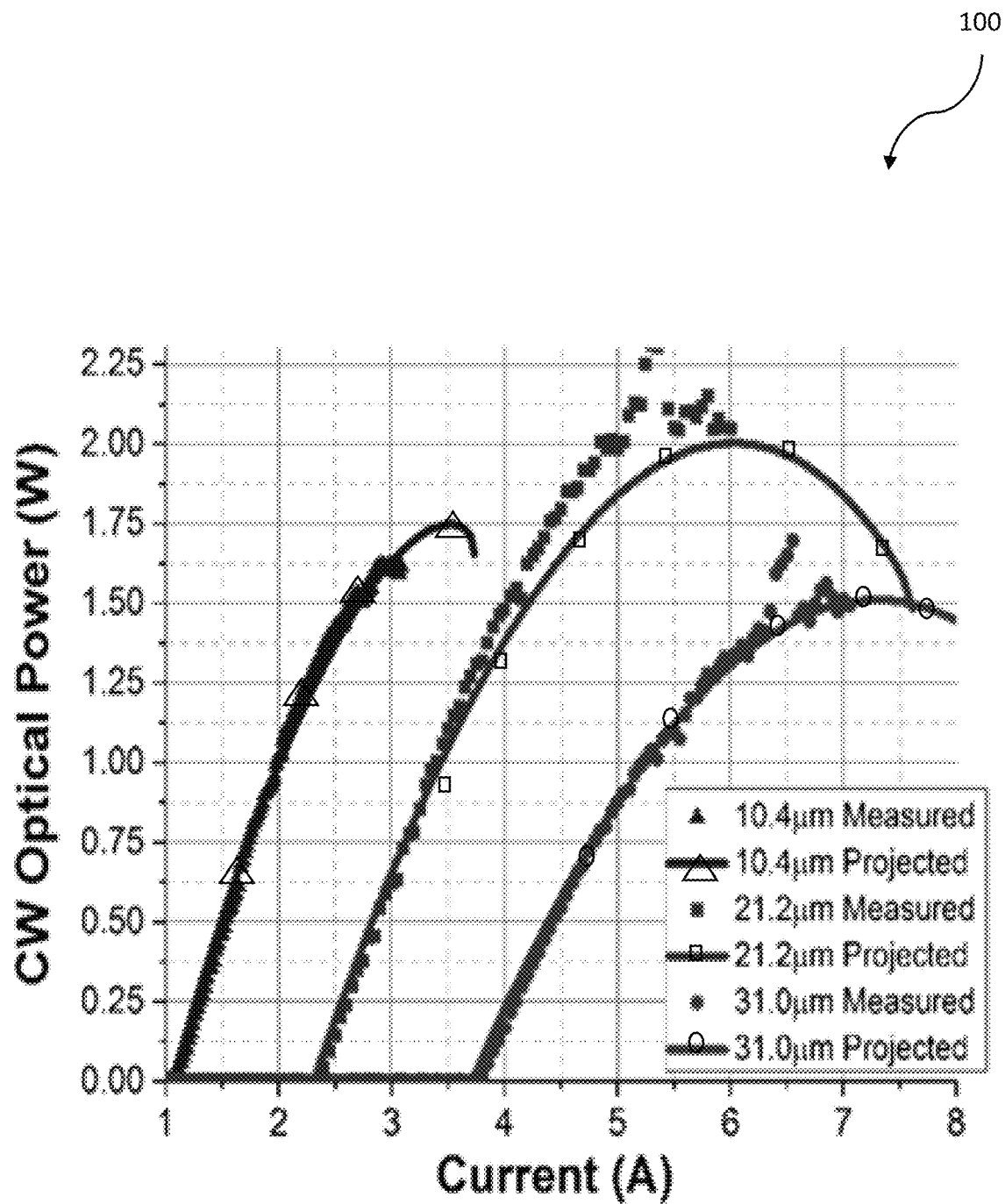
FIG. 1 is a diagram of experimental CW power for the 3.15 mm long, 15-stage HR-coated devices as data points, with projected CW power as solid lines, 10.4 µm wide active region device in triangle marking, 21.2 µm wide active region device in square marking, and 31.0 µm wide active region device in circle marking, according to the present disclosure.

The simulation was written as a script in MATLAB, as available from The MathWorks Inc. of Natick, Mass., taking in the temperature and waveguide results from COMSOL output. It predicted pulsed threshold currents of 0.91 amps, 1.80 amps, and 2.63 amps, and slope efficiencies of $$1.61\frac{W}{A}, 1.60\frac{W}{A}, \text{ and } 1.60\frac{W}{A},$$

for 10.4 µm, 21.2 µm, and 31.0 µm wide active region devices, respectively. The results of the pulsed simulation versus the pulsed experimental data are shown in a diagram 100 of FIG. 1.

For CW operation, the best fit with the experimental data was found for $$k_\perp = 0.9\frac{W}{mK} \text{ and } k_\parallel = 5\frac{W}{mK},$$

both values in accordance with parameters used in [2]. Using these values for cross plane and in plane thermal conductivities, the simulation predicted threshold currents of 1.04 amps, 2.28 amps, and 3.71 amps, for 10.4 µm, 21.2 µm, and 31.0 µm-wide active region devices, respectively. These data show that the model correctly captures all main thermal and optical aspects of CW QCL operation.

Mode Control for Broad-Area QCLs

While CW power scaling with lateral device dimensions for QCLs with reduced number of stages is desirable, it has been shown that midwave and longwave infrared QCLs in a standard configuration (i.e. with 30 to 50 stages) tend toward higher order transverse mode operation near threshold in pulsed operation, with higher order modes becoming prominent with increasing laser core width [3]. The dominant mode for a QCL waveguide near threshold can be predicted using a figure of merit counterbalancing mode confinement to the laser core with net losses of the oscillating mode. The figure of merit is calculated as below, with a higher number indicating a more dominant mode:

$$\frac{\Gamma}{\sum \alpha} \quad (8)$$

Here, $\alpha$ is a source of optical losses. Losses may include free carrier losses from the cladding of the waveguide and mirror losses from facet reflections, with possible contributions from various scattering losses, such as that of sidewall roughness. Mirror loss is given by:

$$\alpha_m = \frac{-\ln(R_1 R_2)}{2L} \quad (9)$$

where $R_1$ and $R_2$ are the reflections of the front and back facets, and L is cavity length.

Thus far, the majority of approaches utilized for transverse mode control in high power QCLs utilize strategic placement of losses in proximity to the sidewalls [4-6] or carefully engineered scattering in the cladding [7, 8] to affect higher order modes to a greater degree than the fundamental. While this successfully achieves single mode operation, the additional losses to the fundamental mode are nonzero, and thus, overall power may be negatively impacted from the unaltered equivalent Fabry-Perot design.

As described above, broad area devices with laser core widths exceeding the traditional 8-12 µm range have demonstrated the ability to scale CW power with device geometry. However, the broadening of the laser core puts the fundamental mode condition at greater risk. As shown in [3], widths as small as 12 µm can demonstrate a multi-lobed field profile in a longwave device with 30 stages, indicating that the dominant lasing mode is not the fundamental, with increasing width not only supporting a higher dominant mode order, but a greater number of modes.

Using two different broad-area QCL designs, the present disclosure experimentally demonstrates in this section that this problem can be resolved employing waveguides with weak confinement. Specifically, two BH QCL designs emitting at 5.6 µm and 4.65 µm are demonstrated with watt level CW performance and single lobed beams. This was achieved in simple Fabry-Perot designs without use of additional introduced losses and only the introduction of highly reflective (HR) coatings on the back facets to improve threshold condition. A figure of merit for lateral model selection with already demonstrated predictive power near threshold in pulsed lasers is utilized to explain their CW behavior.

Figure 3A:
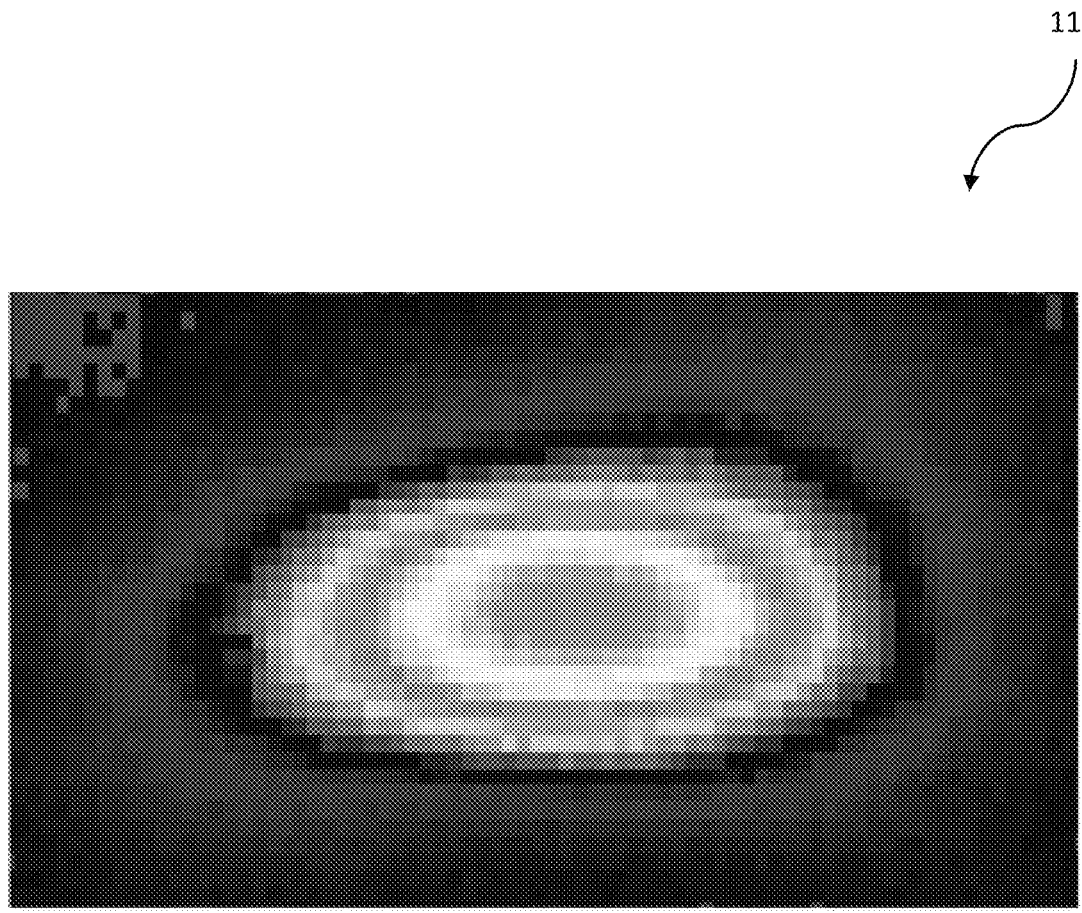
FIGS. 3A-3C are collimated beam images for the 5.7 µm device, respectively with a driving current of 6.0 amps CW (single mode behavior), a driving current of 8.0 amps CW, and a driving current of 10.0 amps CW, according to the present disclosure.
Figure 3B:
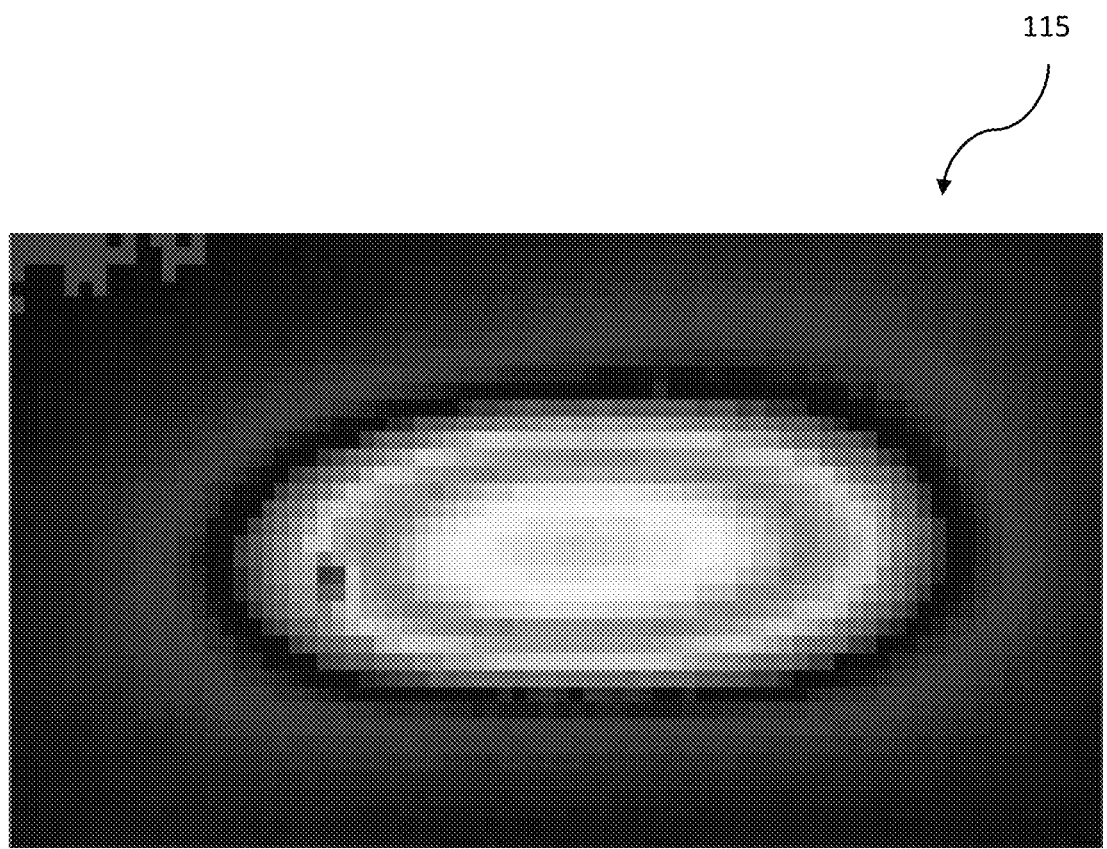
Figure 3C:
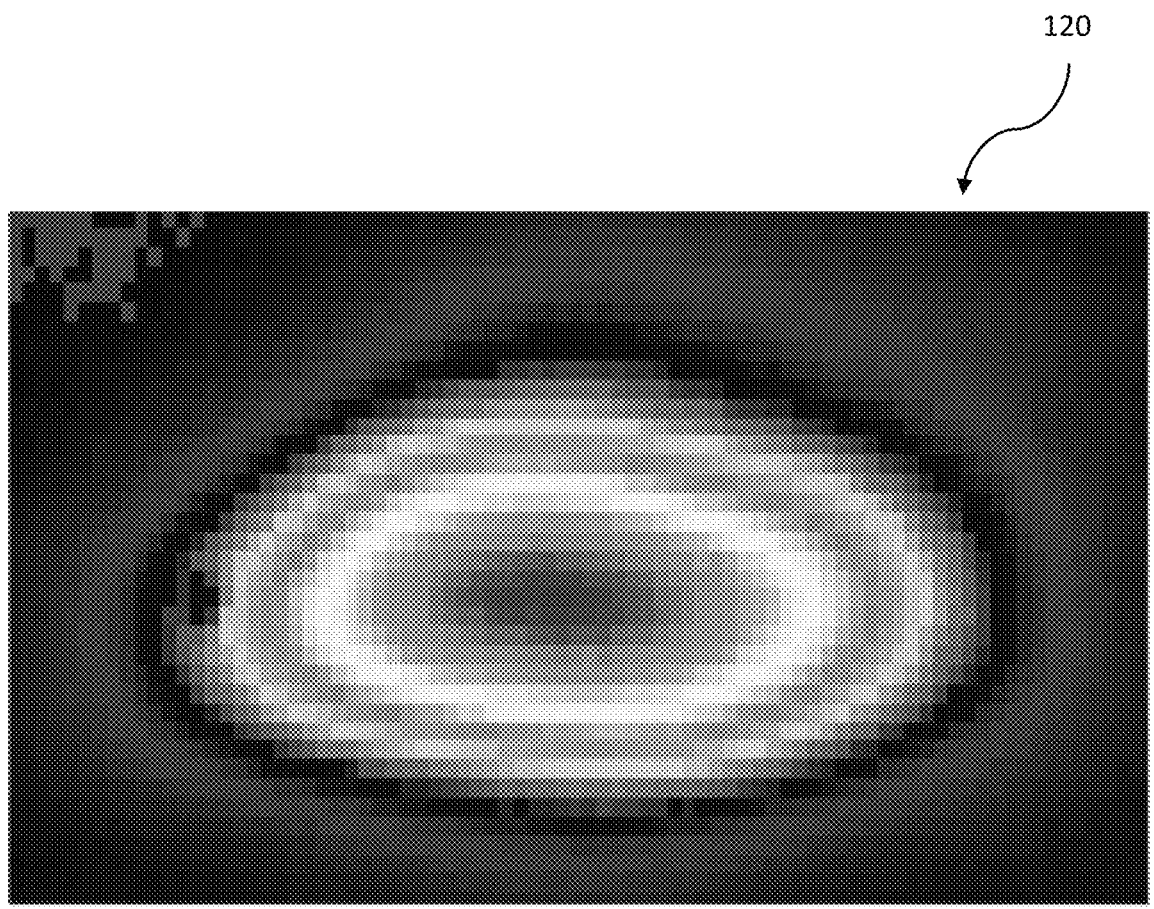

The first design is the 15-stage 5.7 µm BH design described above. The uncoated device was mounted on a microchannel cooler with water chilled to 5° C. to keep an approximate 20° C. temperature on the QCL chip itself under full driving conditions. The CW LIV curve for an uncoated 6.3 mm×21.2 µm device of this design is shown in a diagram 105 of FIG. 2. The device maintains a single lobed mode profile throughout its CW dynamic range, shown in diagrams 110, 115 of FIGS. 3A and 3B, respectively. The mode in a diagram 120 of FIG. 3C has a slightly broader profile at 10 amps. This indicates that one or more higher-order transverse modes are participating in lasing.

The multiple modes add to overall power by extracting energy from different portions of the gain volume, causing the "bump" in power when they turn on after 10 amps. However, while broadened, this mode is still single lobed and measured $M^2$ at this point is about 1.5 (±0.3). Also, no appreciable beam wander was observed for this device throughout the entire driving range. To summarize, these data demonstrate CW 5 W operation with a high beam quality and a good beam pointing stability.

Figure 4A:
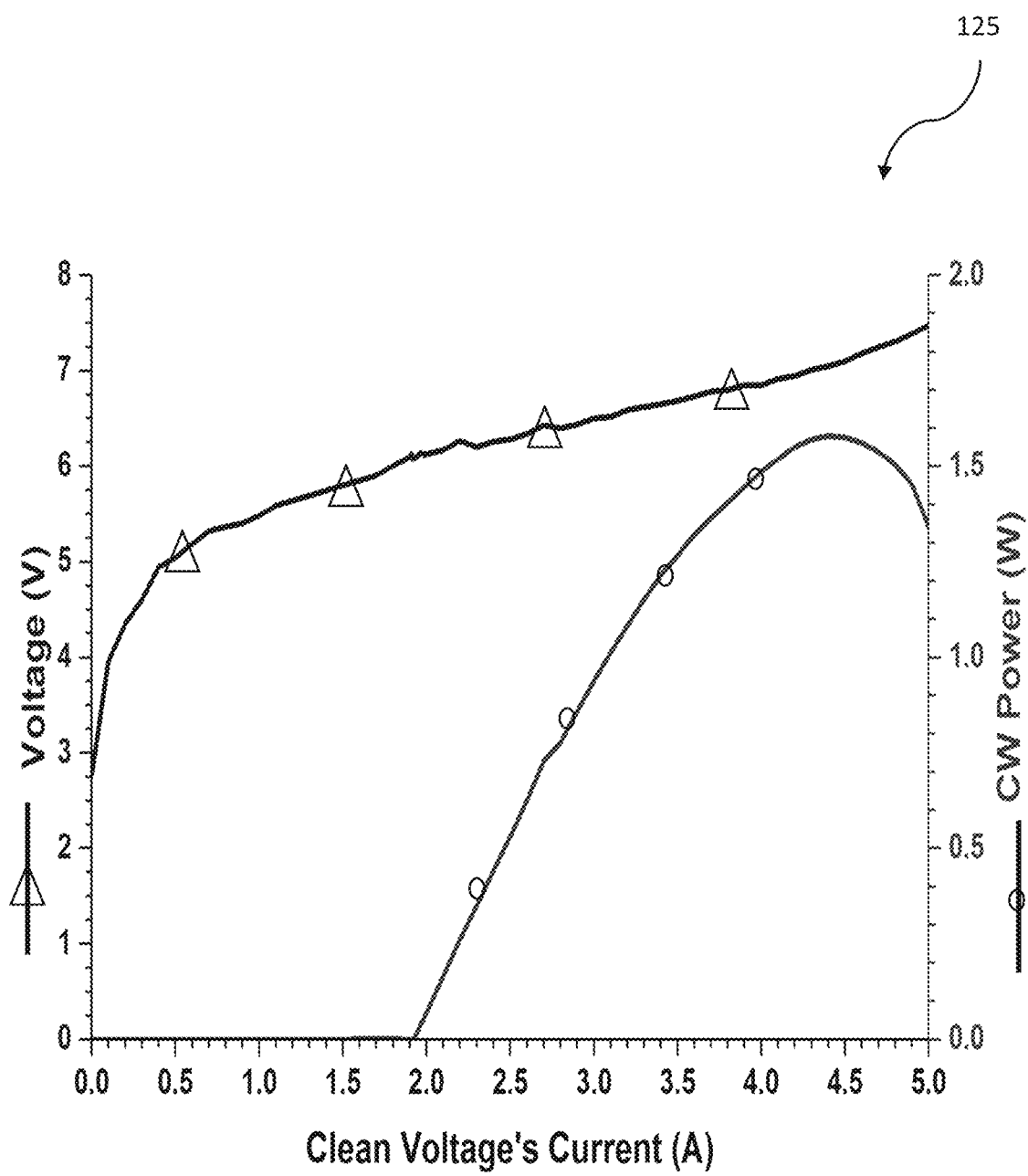
FIGS. 4A and 4B respectively are a diagram of a Light-Power-Voltage curve for the 4.65 µm emitting QCL, and a collimated beam image for the 4.65 µm device with a driving current of 4 amps CW (single mode behavior at maximum output power), according to the present disclosure.
Figure 4B:
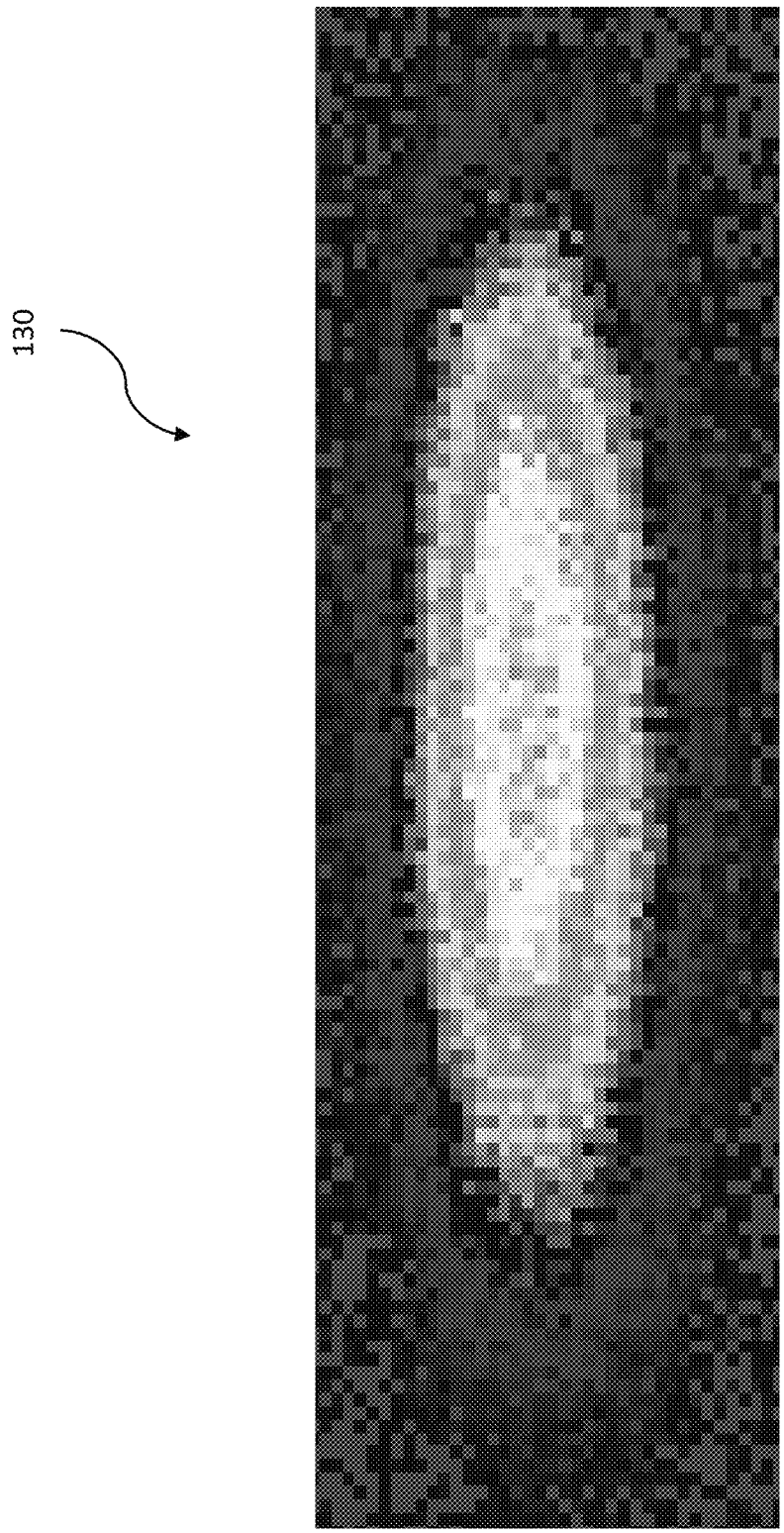

The second 4.65 µm design, similar to the one described in [9], utilizing fifteen 43 nm thick stages in the laser core, was grown with a similar waveguide pattern as the first design. A 3.1 mm×18 µm device was HR coated, mounted on a microchannel cooler, and run in CW operation in an identical fashion to the first device. The LIV shown in a diagram 125 of FIG. 4A shows the device achieving a CW power of 1.6 W. The smooth power curve is indicative of a lack of mode hopping demonstrated by the previous device at maximum power. The single mode behavior demonstrated in a diagram 130 of FIG. 4B is maintained throughout the entire CW dynamic range.

Defining the relative figure of merit as the figure of merit defined in Equation 1 divided by that of the fundamental mode ($TM_{00}$) the single mode behavior of the two devices can be explained as the fundamental mode achieving the highest relative figure of merit for each device as tabulated in Table 1. Calculations take into account mirror losses and waveguide losses, but assume no scattering losses. Scattering losses, which are proportional to the square of sidewall roughness [10], are estimated to be negligibly small and their inclusion would only reinforce the advantage of the fundamental mode due to their disproportionate growth with mode order.

The single-moded behavior of the two devices can be explained by the figure of merit. The difference of relative figure of merit between the fundamental and nearest competing mode is 0.038 and 0.018 for the 5.7 µm and 4.65 µm emitting devices, respectively. For comparison to the work of Yu, et al. using A of about 7 µm (±0.7 µm) emitting, 30 stage devices [3], the 12 µm wide case had a relative difference of 0.009 and the 22 µm wide case a difference of 0.054, demonstrating mode discrimination even for small differences in relative merit.

Expanding the discussion on the figure of merit from the two devices presented to a more general case, the figure of merit in this analysis has three components: confinement factor, mirror loss, and waveguide loss. The alteration of laser core geometry directly affects confinement factor, which in turn affects effective refractive index and losses. The dependence of mode behavior on core thickness can be examined by calculating the figure of merit for the two active region designs while performing a numerical sweep over number of laser core stages (effectively, laser core thickness along the growth direction.)

TABLE 1

Relative figures of merit for 5.7 µm and 4.65 µm devices demonstrated.

| Mode | 5.7 µm Wavelength 5.2 mm × 21.2 µm (HR Coated) | 4.65 µm Wavelength 3.1 mm × 18.0 µm |
|---|---|---|
| $TM_{00}$ | 1.000 | 1.000 |
| $TM_{01}$ | 0.962 | 0.982 |
| $TM_{02}$ | 0.843 | 0.920 |
| $TM_{03}$ | — | 0.333 |

A broad area design of an uncoated 5 mm long, 20 µm wide is used for these calculations. These simulated results are calculated from a numerical waveguide analysis in COMSOL Multiphysics utilizing a finite element method that provides a complex valued effective modal index and confinement factor. Waveguide absorption is taken from the imaginary portion of effective index. The calculation of mirror losses for different mode orders comes from a 2D ray optical picture, as in [3]. Higher order modes can be described as having a higher propagation angle within the waveguide. This angle modifies the internal reflection of the mode against the facets as described by Snell's Law and Fresnel reflection.

Reducing the number of stages significantly weakens vertical confinement, allowing the mode to "bleed out" into the cladding, both vertically and horizontally. This overall weakening of confinement factor causes higher order modes to lose the guiding condition. This can be visualized by the effective index method approximation, where the effective indices calculated along slices of the growth direction are used to construct a virtual waveguide in the lateral direction to calculate a net effective modal index. Reduced growth direction confinement lowers the growth direction effective index. The surrounding lateral bulk in the BH configuration then has a reduced index contrast with the virtual guiding layer. The reduced index contrast reduces confinement factor and supports fewer modes. Effective index of a mode reduces with stage number (laser core thickness) indicative of more of the mode existing in the lower index cladding layers. In broad area BH waveguides, there is a difference of approximately 5% to 10% in confinement factor between $TM_{00}$ and $TM_{01}$ modes for stage number changing in the range from 30 and 15 stages. At the same time, free-carrier losses are nearly identical across mode order, due to the outer portion of the modes overlapping the same nearby cladding regions in similar proportions. Finally, well confined higher order modes have mirror losses lower than the fundamental by a nearly constant amount as number of stages is varied and all decrease gradually with cavity length as expected from Equation 2.

Figure 5:
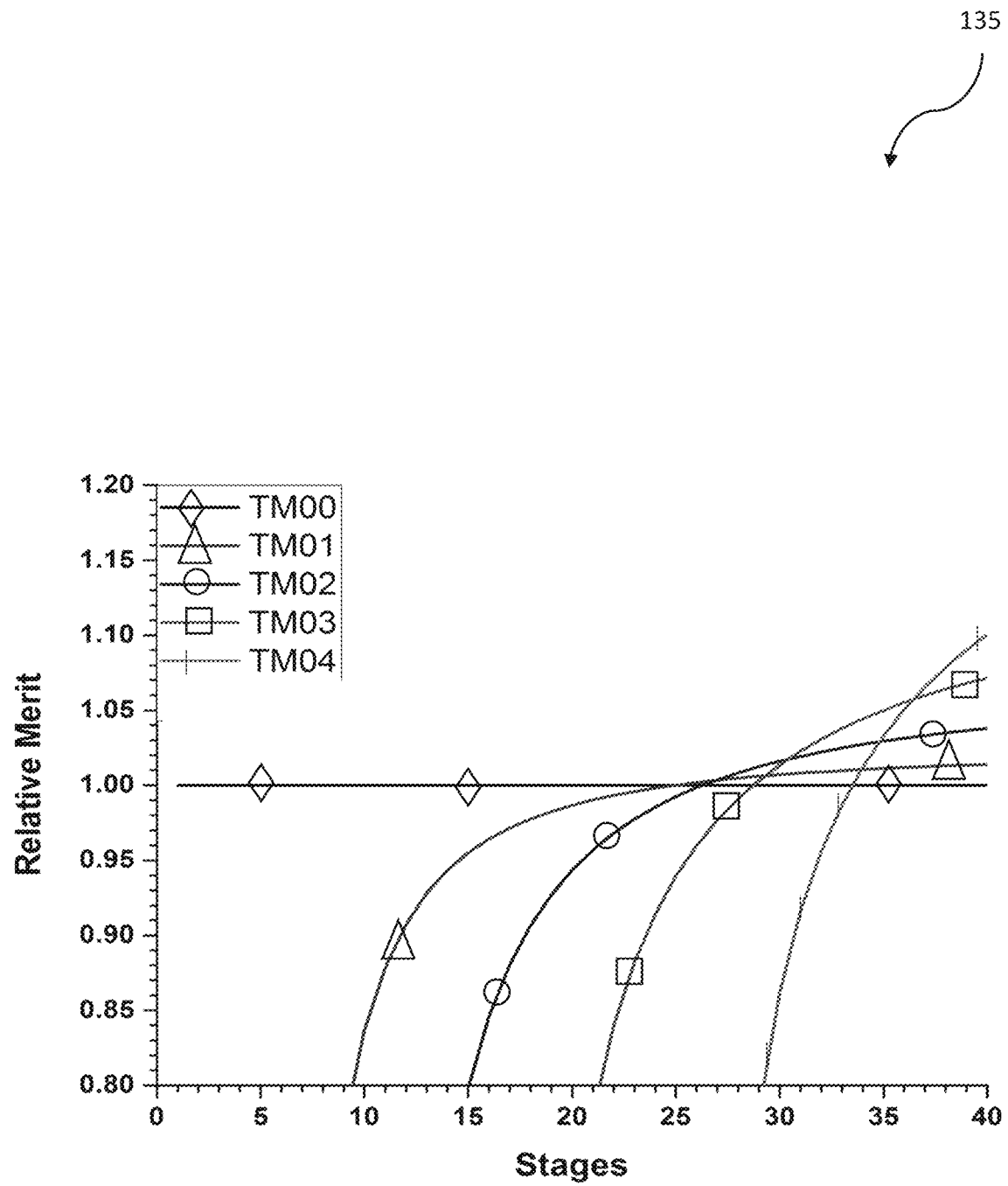
FIG. 5 is a diagram of relative figure of merit for the 5.7 µm emitting, uncoated QCL design in a 5 mm×20 µm form factor as a function of number of stages in the laser core, according to the present disclosure.

The combined effect of these trends gives rise to the relative merit curves shown in a diagram 135 of FIG. 5, which is based upon a 5.7 µm wavelength device with a size of 5 mm×20µ. Starting with a single QCL stage, the thinnest possible laser core, only the fundamental mode is supported, with relative merit identically 1 (the diamond hatched horizontal line.) As the number of stages (the thickness of the laser core) increases, more transverse modes are supported by the waveguide, but relative merit still favors fundamental mode operation. When number of stages grows to a sufficient number, $TM_{01}$'s figure of merit overtakes the fundamental, showing as a relative merit greater than 1 and the dominant mode. This is soon overtaken by that of $TM_{02}$, and so one, with each domain of higher order mode dominance smaller than the previous mode's. While 1-20 or so stages may remain comfortably fundamental mode dominated, the range of 21-40 stages quickly promotes subsequent higher order modes to dominance as number of stages increases.

It is helpful to point out here that the described approach of controlling beam quality in broad-area BH QCLs is compatible with CW power scaling approach with lateral dimensions described in the previous section. Further improvement in power and reliability can be achieved by introducing InP spacers in the QCL waveguide, which is discussed next.

Broad-Area QCL with InP Spacers

Figure 6:
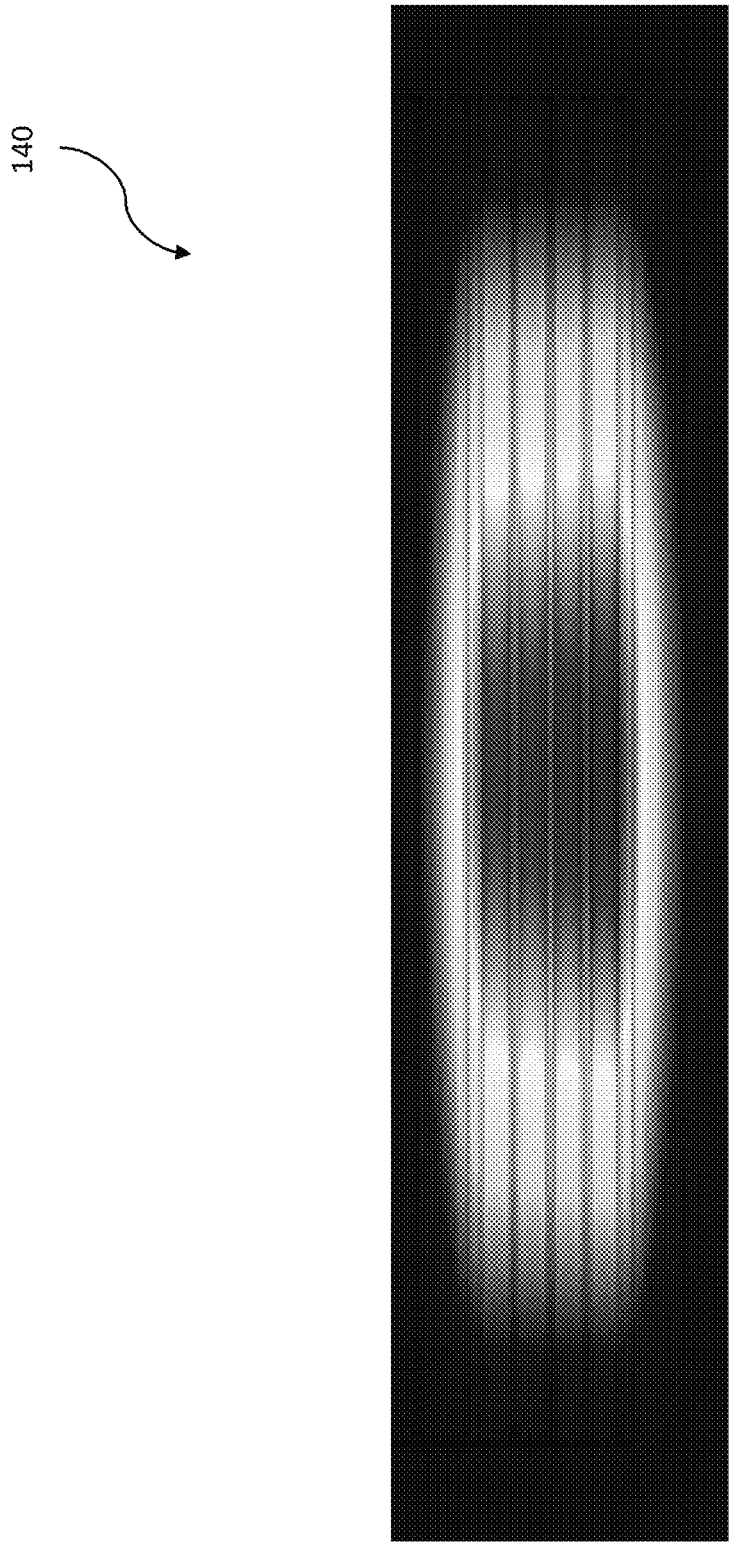
FIG. 6 is a diagram of near field intensity distribution for 10 mm×25 µm devices with interrupted core design, according to the present disclosure.
Figure 7A:
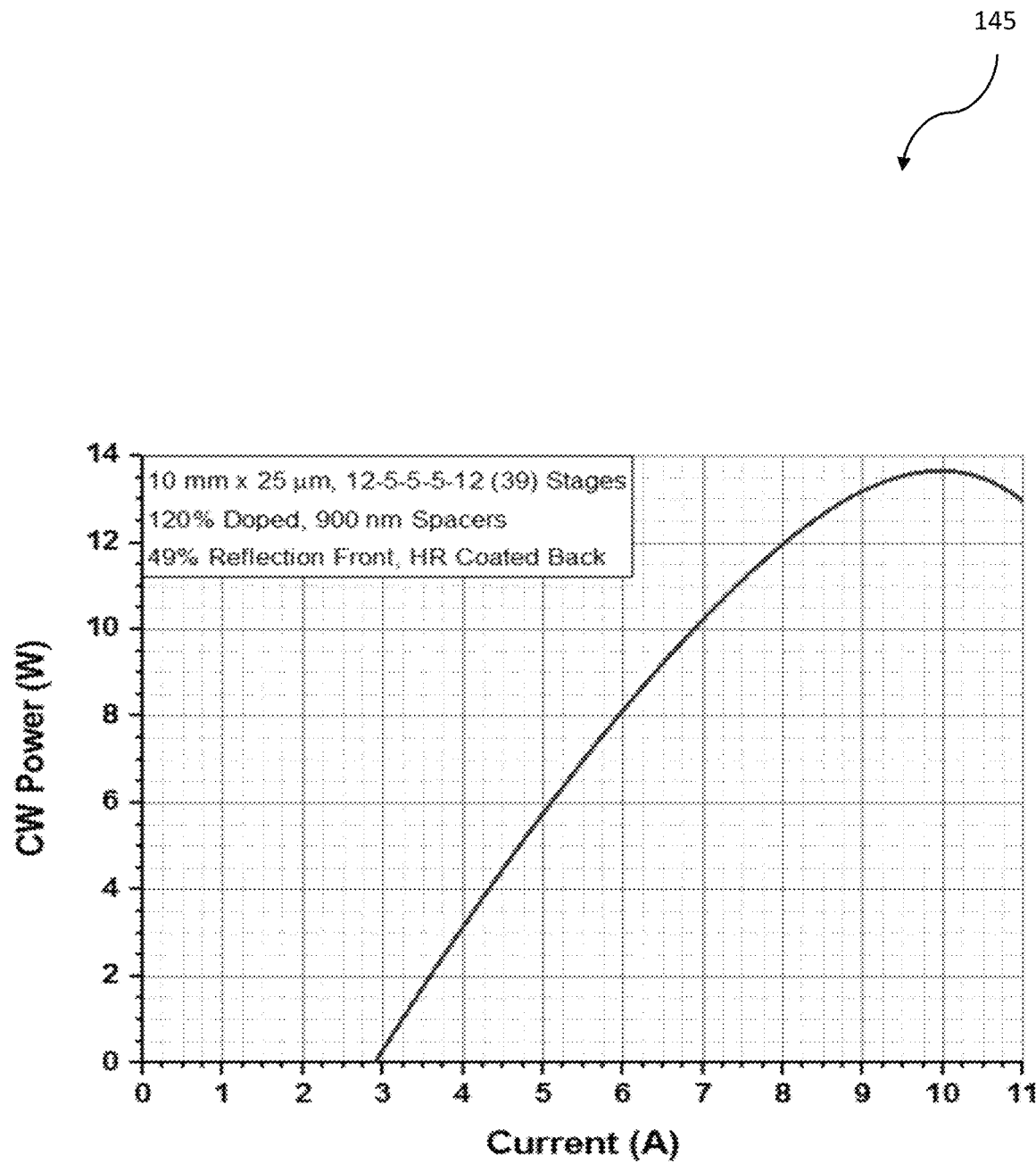
FIGS. 7A and 7B are diagrams of projected CW power for the preliminary high power five stack design, and mode competition analysis based on the figure of merit described in FIG. 5, respectively, according to the present disclosure.

As detailed above, a weak waveguide is the critical condition for fundamental mode dominance in the broad-area configuration. This condition can be achieved by reducing number of active region stages to about 15 (±3 stages). However, reduced number of stage would also result in reduced laser slope efficiency. To increase number of stages and therefore regain a high slope efficiency, while still keeping a low mode overlap with the active region, InP interstacks in the waveguide structure of broad-area QCLs can be employed. The approach is illustrated in a diagram 140 of FIG. 6. In this exemplary design, there are five active region ministacks separated by 0.9 µm-thick InP spacers with 12st-InP-5st-InP-5st-InP-5st-InP-12 layer sequence. The four outer ministacks carrying the most of the active region stages have a low overlap with the guided mode. Therefore, overall mode overlap factor with the active region is still low. At the same time, since QCL slope efficiency is proportional to total number of stages (39 in FIG. 6), the laser can deliver a very high optical power. CW optical power projections shown in a diagram 145 of FIG. 7A demonstrate that even in this non-optimized exemplary configuration such devices can produce well over 10 W of CW power in a high brightness beam. Advantageously, the model input parameters characterizing active region stage design, such as laser injection efficiency and transparency current, were taken to be equal to experimentally determined parameters for a fully characterized 40-stage 4.6 µm QCL structure.

The InP ministacks provide three additional critical practical advantages. First, they significantly improve laser thermal resistance, which translates to improved CW efficiency. In addition, they "stretch" the mode vertically, bringing peak intensity at the output laser facet down to its safe limits. Therefore, a very high optical power can be achieved for broad-area QCLs with InP spacers without compromising their long-term reliability. Finally, the spacers reduce beam ellipticity, making it easier to design downstream beam shaping optics for practical applications.

Figure 7B:
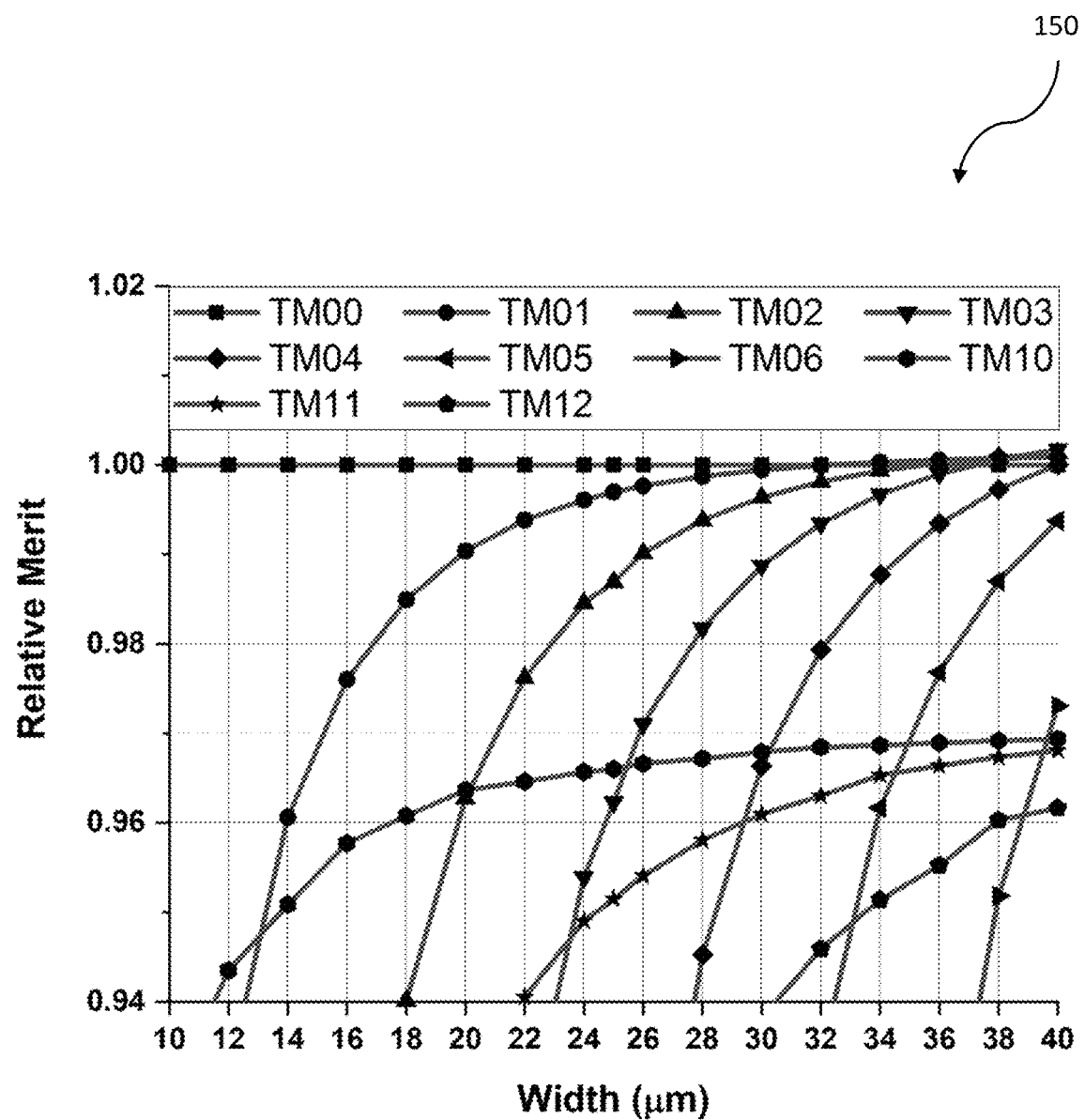

FIG. 7B (diagram 150) shows calculated figure of merit vs. ridge width for the five-stack design. Based on these projections, it is expected that, similar to broad-area devices described in the previous section, the five-stack QCL will operate on fundamental mode.

Broad-Area RWG QCLs with InP Spacers

To summarize previous two subsections, high-brightness CW BH broad-area devices can be realized employing a QCL waveguide with InP spacers and low mode overlap with the active region. Similar design principles can be applied to RWG devices.

To illustrate the approach, preliminary projections for this configuration are carried out. A high brightness design for three laser core stripes in double channel ridge configuration had a maximum CW power of 3.7 W with acceptable mode quality and low thermal resistance. Simulation results are summarized in diagrams 155, 160 of FIGS. 8A and 8B, respectively. A high brightness result was achieved for a 5 mm×15 µm form factor, including a pattern of 5-10-5 stage stacks separated by 900 nm of InP:Si $4E16/cm^3$ cladding spacers, identical to the cladding immediately above and below the multi-stack. The stages were doped at an identical the concentration of the previously grown design to extend the dynamic range, taking advantage of the low thermal resistance and operating temperature. 3.7 W of power was achieved with a thermal resistance of 1.91 K/W. CW wall-plug efficiency reached up to 16.2%. Peak intensity at the facet would be below the approximate (experimentally determined) optical damage threshold of about 16 $MW/cm^2$.

This design is largely unoptimized and is used as a proof-of-concept for watt level CW power with high brightness and low thermal resistance in broad-area RWG configuration. Power scaling with increased ridge width, cavity length, or increased number of stages would likely yield higher numbers without sacrificing thermal resistance, optical damage risk, or transverse mode quality. The double channel configuration, assumed to be electroplated to fill the trenches adjacent to the central ridge with gold or a similarly electrically and thermally conductive substance, allows for enhanced heat flow out of the laser core. It does improve confinement for higher order modes, which is reflected in the figure of merit calculations as the ridge is widened past 20 µm. Adjusting the interstack spacers and number of stages can compensate for this mode competition while potentially increasing overall power as a design optimization.

Figure 8A:
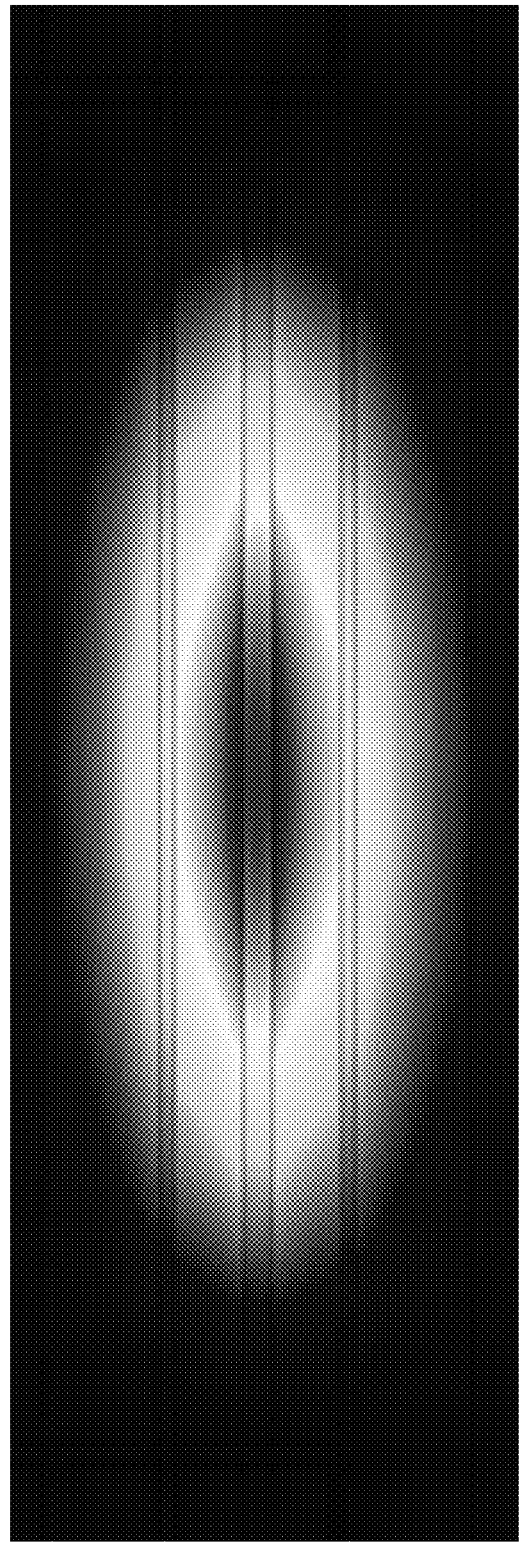
FIGS. 8A and 8B are diagrams of a near field intensity distribution and a projected output power for 5 mm×15 μm ridge-waveguide devices with interrupted core design, respectively, according to the present disclosure.
Figure 8B:
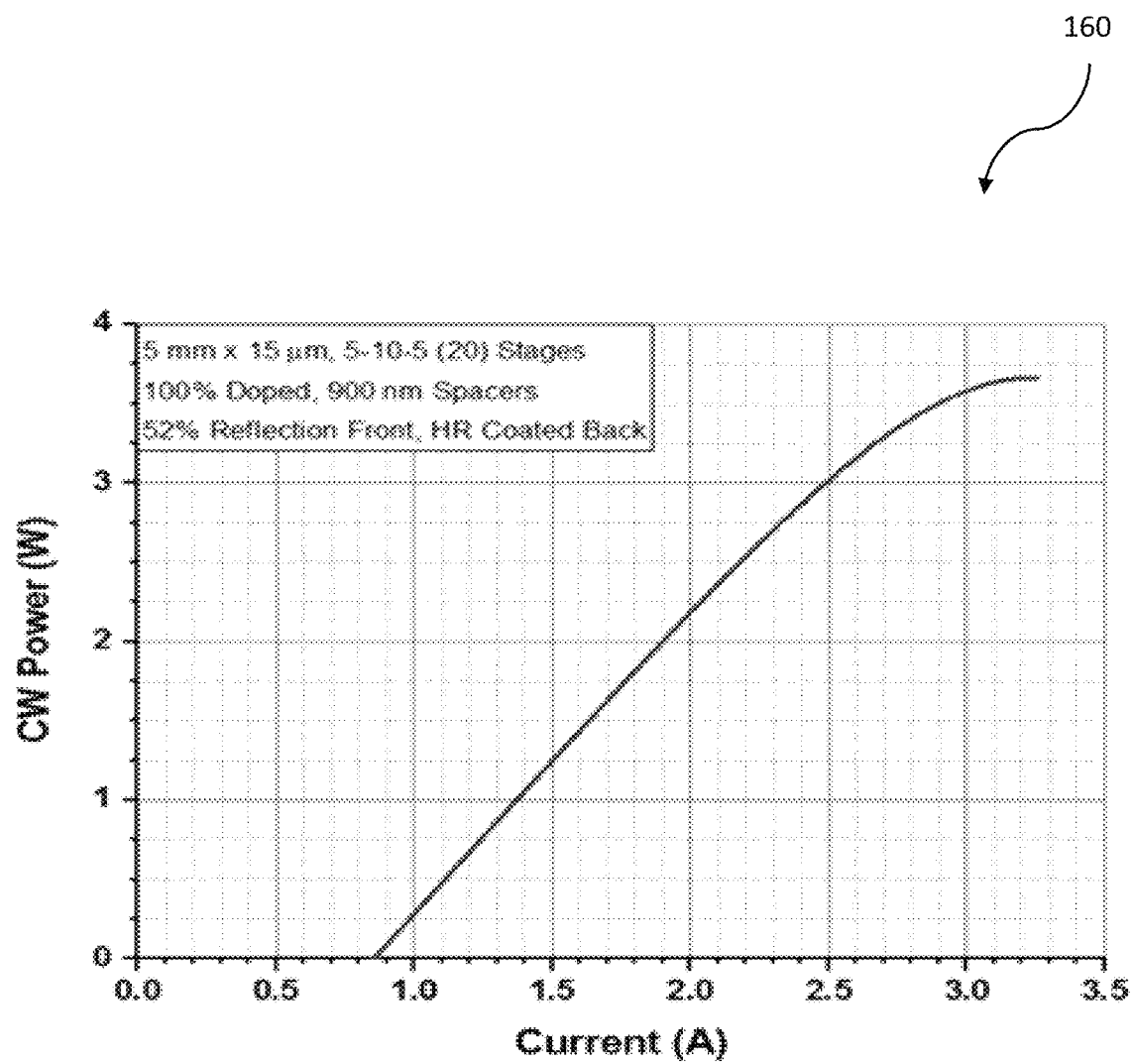
Figure 9:
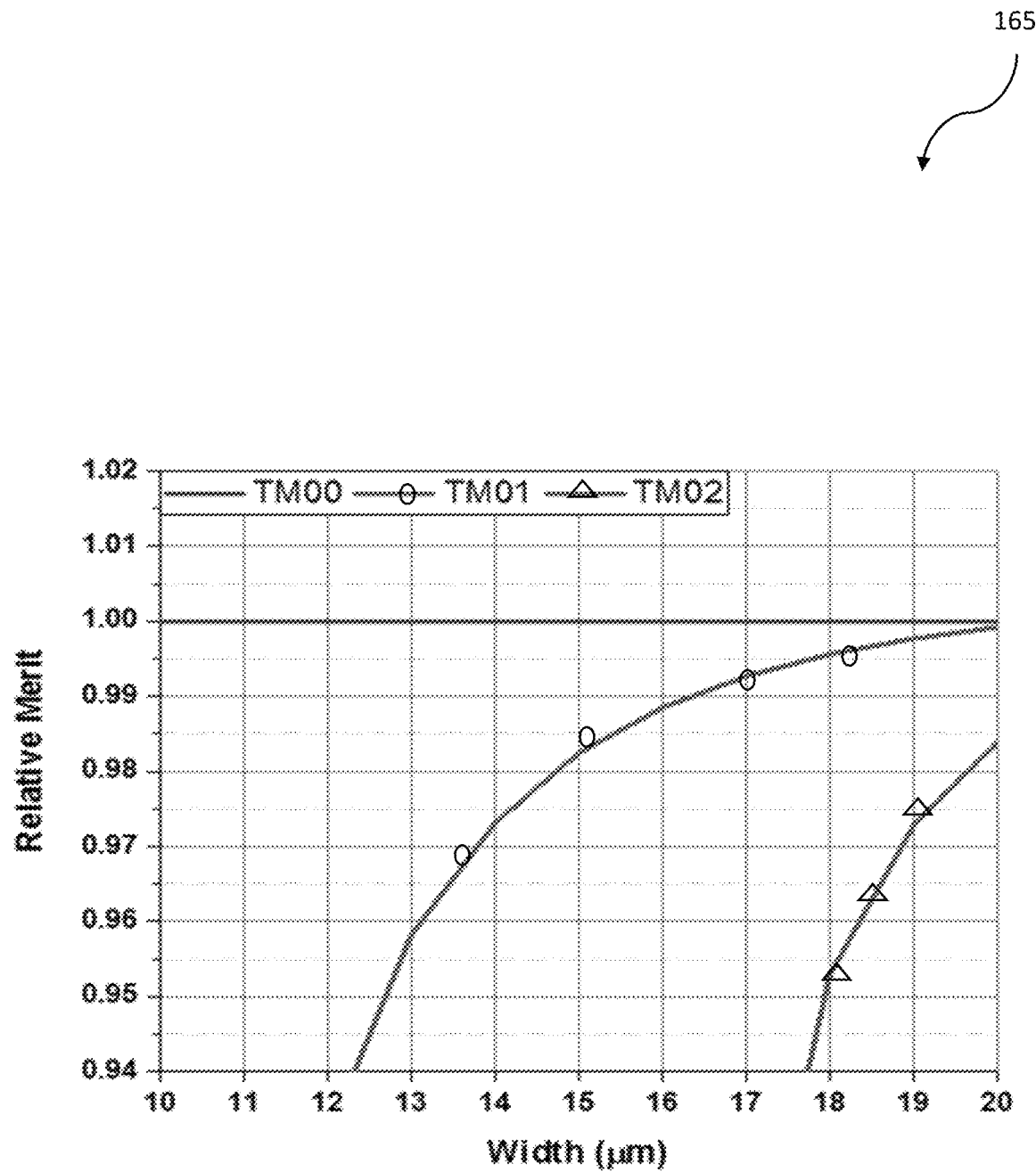
FIG. 9 is a diagram of relative figure of merit calculations for the optimized high brightness three stack RWG design, according to the present disclosure.

Figure of merit calculations show that fundamental mode operation remains prominent for this design until the ridge width is expanded wider than about 20 µm (±1 µm) (FIGS. 8A-8B). While the laser core does have an enhanced thickness, the waveguide does not support multiple vertical transverse modes. Additional lateral confinement from the SiN+Au sidewalls appear to allow the $TM_{01}$ mode to become dominant at a ridge width 21 µm. Again, the design is not optimized, and mode competition can be manipulated with laser core modifications. FIG. 9 shows a diagram 165 of relative figure of merit calculations for the optimized high brightness three stack RWG design.

Figure 10:
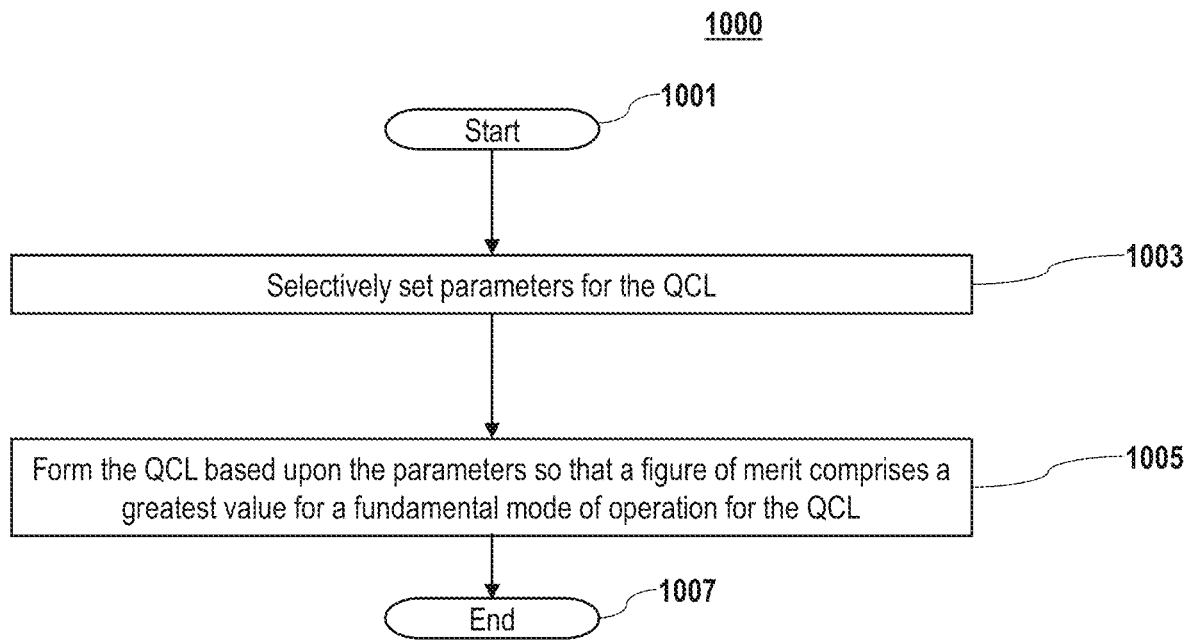
FIG. 10 is a flowchart of a method for making a QCL, according to the present disclosure.
Figure 12:
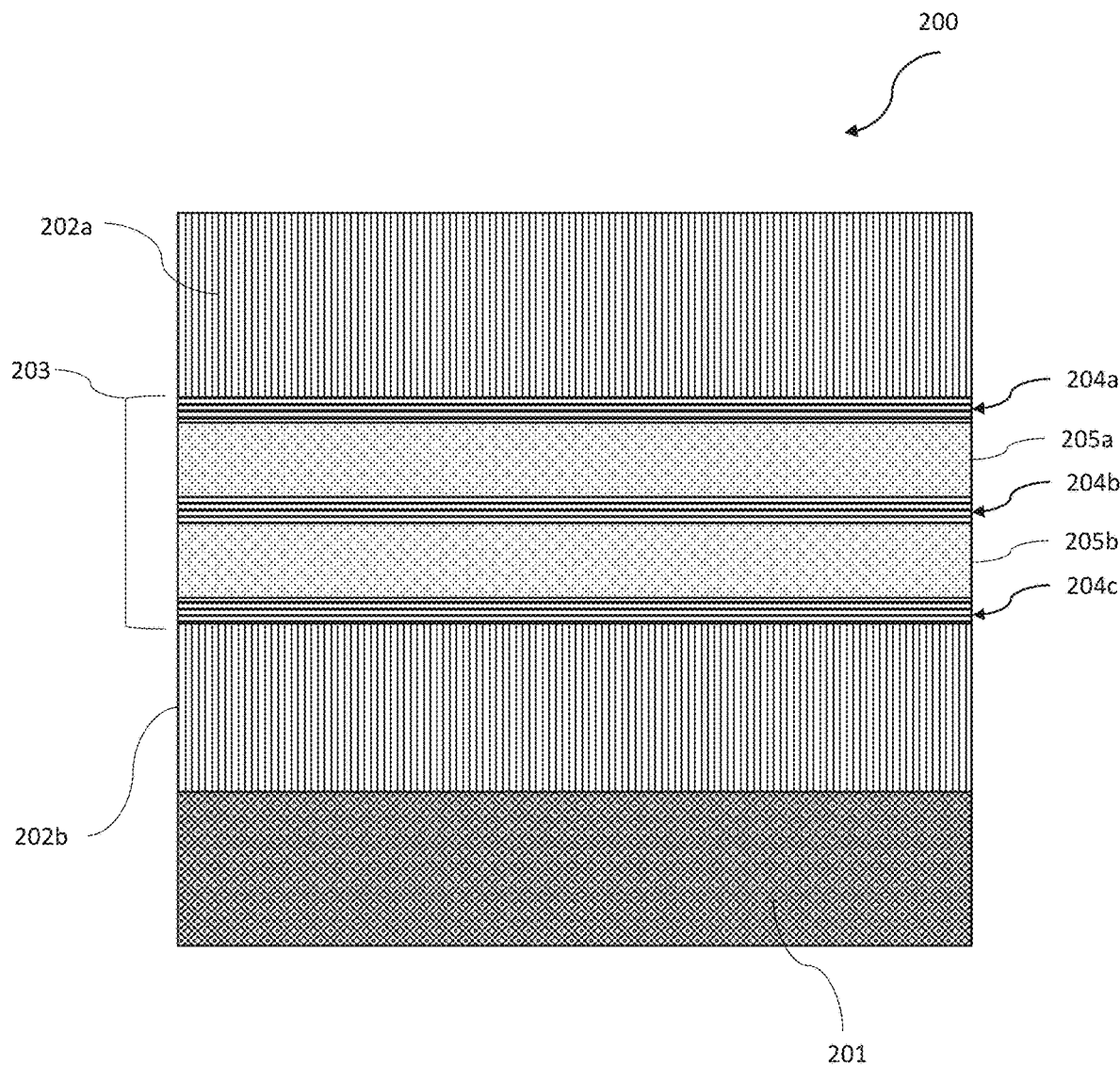
FIG. 12 is a schematic cross-sectional view of a QCL, according to the present disclosure.

Referring now to FIGS. 10 and 12, a method for making a QCL 200 is now described, which begins at Block 1001 in a flowchart 1000. It should be appreciated that any of the features described hereinabove can be integrated in this method.

The QCL 200 illustratively includes a plurality of InP spacers 205a-205b within a laser core 203 surrounded by waveguide cladding material composed of semiconductor material 202a-202b. Of course, in other embodiments, the QCL 200 may comprise a single InP spacer. Also, the spacer may comprise additional elements, or in other embodiments, the InP may be replaced with an alternative semiconductor material. The QCL 200 is to provide a CW output, but could also provide pulsed output additionally. The QCL 200 may comprise one of a BH configuration or an RWG configuration.

The method comprises selectively setting a plurality of parameters for the QCL 200. (Block 1003). The plurality of parameters include a number of the plurality of InP spacers 205a-205b, a thickness for each InP spacer, a number of stages in the laser core 203, and a dopant concentration value in the laser core. In some embodiments, the plurality of parameters also comprises a number of spaced apart active region stacks in the laser core 203. The method comprises forming the QCL 200 based upon the plurality of parameters so that a figure of merit comprises a greatest value for a fundamental mode of operation for the QCL. (Blocks 1005, 1007).

In the illustrated embodiment, the spaced apart active region stacks comprise outer active region stacks 204a, 204c and an inner active region stack 204b. The inner active region stack 204b has a different number of layers than the outer active region stacks 204a, 204c.

Figure 13:
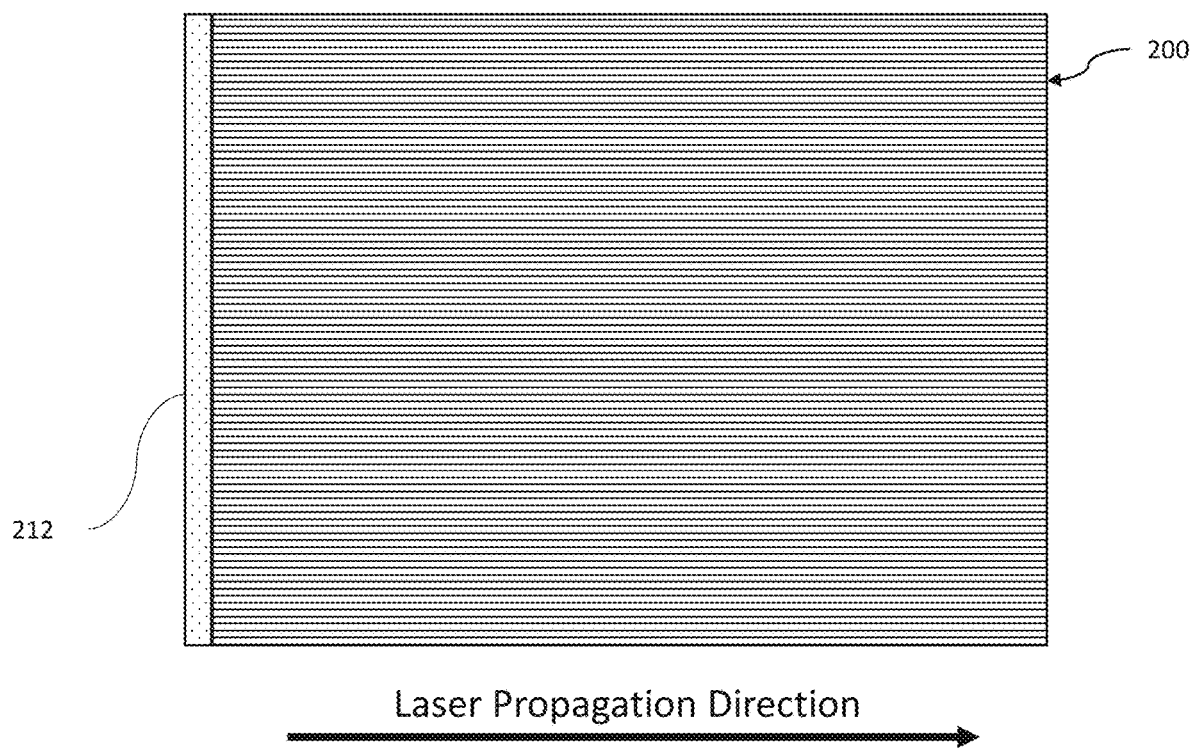
FIG. 13 is a schematic diagram of the QCL, according to the present disclosure.

Also, the method may further comprise determining a threshold current value during the CW output based upon a threshold current value during pulsed output and an ambient temperature value. Referring now to FIG. 13, the method may further comprise forming a HR coatings 212 on a back facet of the QCL 200. Referring now to FIG. 12, the method may further comprise forming the laser core 203 to have a width greater than 20 µm.

The method may further comprise forming the QCL 200 to have a double channel configuration, and forming trenches adjacent a central ridge with a thermally conductive material. The plurality of parameters may comprise a transparency current value, loss values, a differential gain value, an injection efficiency value, and a sub-linearity of a pulsed power versus current density value.

Figure 11:
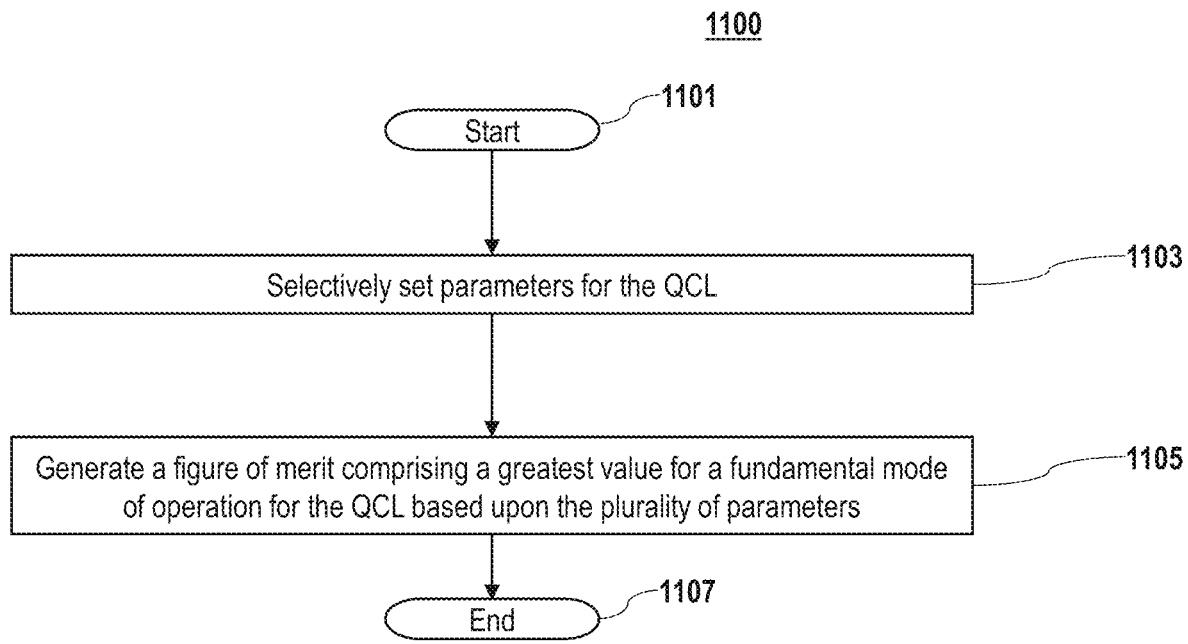
FIG. 11 is a flowchart of a method for predicting performance of a QCL, according to the present disclosure.

Referring now to FIGS. 11 and 12, a method for predicting performance of a QCL 200 is now described, which begins at Block 1101 in a flowchart 1100. It should be appreciated that any of the features described hereinabove can be integrated in this method. The QCL 200 illustratively includes a plurality of InP spacers 205a-205b within a laser core 203. Of course, in other embodiments, the QCL 200 may comprise a single InP spacer. The QCL 200 is to provide a CW output, but could also provide pulsed output additionally.

The method illustratively comprises selectively setting a plurality of parameters for the QCL 200. The plurality of parameters comprises a number of the at least one InP spacer 205a-205b, a thickness for each InP spacer, a number of stages in the laser core 203, and a dopant concentration value in the laser core. (Block 1103). The method also includes generating a figure of merit comprising a greatest value for a fundamental mode of operation for the QCL 200 based upon the plurality of parameters. (Blocks 1105, 1107).

Referring now to FIG. 12, a QCL 200 according to the present disclosure is now described. It should be appreciated that any of the features described hereinabove can be integrated in this QCL 200. The QCL 200 illustratively comprises a substrate 201, a semiconductor layer defining a laser core 203, and semiconductor layers 202a-202b adjacent the laser core 203 guiding the laser mode to the laser core. The laser core 203 illustratively includes a plurality of active region stacks 204a-204c.

Each active region stack 204a-204c comprises a plurality of active region layers, and a respective InP spacer 205a-205b between respective ones of the plurality of active region stacks. The QCL 200, as shown in FIG. 13, further comprises an HR coating 212 on a back facet.

In some embodiments, each layer in the plurality of active region layers 204a-204c may have an identical layer thickness. In other embodiments, each layer in the plurality of active region layers 204a-204c may have varying layer thickness between different active region stacks 204a-204c or even within each active region stack.

REFERENCES

1. A. Lyakh, M. Suttinger, R. Go, P. Figueiredo, and A. Todi, "5.6 µm quantum cascade lasers based on a two-material active region composition with a room temperature wall-plug efficiency exceeding 28%", Applied Physics Letters 109, 121109 (2016)
2. M. P. Semtsiv, and W. T. Masselink, "Above room temperature continuous wave operation of a broad-area quantum-cascade laser," Appl. Phys. Lett. 109, 203502 (2016)
3. Yu, N., et al., Near-field imaging of quantum cascade laser transverse modes. Opt Express, 2007. 15(20): p. 13227-35.
4. Heydari, D., et al., High brightness angled cavity quantum cascade lasers. Applied Physics Letters, 2015. 106(9): p. 091105.
5. Kaspi, R., et al., Extracting fundamental transverse mode operation in broad area quantum cascade lasers. Applied Physics Letters, 2016. 109(21): p. 211102.
6. Kaspi, R., et al., Distributed loss method to suppress high order modes in broad area quantum cascade lasers. Applied Physics Letters, 2017. 111(20): p. 201109.
7. Bai, Y., et al., Photonic crystal distributed feedback quantum cascade lasers with 12 W output power. Applied Physics Letters, 2009. 95(3): p. 031105.
8. Lu, Q. Y., et al., Holographic fabricated photonic-crystal distributed-feedback quantum cascade laser with near-diffraction-limited beam quality. Opt Express, 2009. 17 (21): p. 18900-
9. Go, R., et al., Room temperature operation of quantum cascade lasers monolithically integrated onto a lattice-mismatched substrate. Applied Physics Letters, 2018. 112: p. 031103
10. Toor, F., et al., Effect of waveguide sidewall roughness on the threshold current density and slope efficiency of quantum cascade lasers. Applied Physics Letters, 2008. 93(3): p. 031104
11. Bismuto, A., et al., Large cavity quantum cascade lasers with InP interstacks. Applied Physics Letters, 2008. 93(23): p. 231104.
12. Liu, J., et al., A mini-staged multi-stacked quantum cascade laser for improved optical and thermal performance. Vol. 24. 2009. 075023.

Many modifications and other embodiments of the present disclosure will come to the mind of one skilled in the art having the benefit of the teachings presented in the foregoing descriptions and the associated drawings. Therefore, it is understood that the present disclosure is not to be limited to the specific embodiments disclosed, and that modifications and embodiments are intended to be included within the scope of the appended claims.

That which is claimed is:

1. A method for making a quantum cascade laser (QCL) having at least one InP spacer within a laser core, the QCL to provide a continuous wave (CW) output, the method comprising:
   selectively setting a plurality of parameters for the QCL, the plurality of parameters comprising
   a number of the at least one InP spacer,
   a thickness for each InP spacer, a number of stages in the laser core,
   a number of spaced apart active region stacks in the laser core, and
   a dopant concentration value in the laser core, the spaced apart active region stacks comprising outer active region stacks and inner active region stacks, the inner active region stacks having a different number of layers than the outer active region stacks; and
   forming the QCL based upon the plurality of parameters so that a figure of merit comprises a greatest value for a fundamental mode of operation for the QCL.

2. The method of claim 1 wherein the QCL comprises one of a buried heterostructure (BH) configuration or a ridge waveguide (RWG) configuration.

3. The method of claim 1 further comprising determining a threshold current value during the CW output based upon a threshold current value during pulsed output and an ambient temperature value.

4. The method of claim 1 further comprising forming a highly reflective (HR) coatings on a back facet of the QCL.

5. The method of claim 1 further comprising forming the laser core to have a width greater than 20 μm.

6. The method of claim 1 further comprising forming the QCL to have a double channel configuration, and forming trenches adjacent a central ridge with a thermally conductive material.

7. The method of claim 1 wherein the plurality of parameters comprises a transparency current value, loss values, a differential gain value, an injection efficiency value, and a sub-linearity of a pulsed power versus current density value.

8. The method of claim 1 further comprising forming semiconductor layers adjacent to the laser core and guiding a laser mode into the laser core.

9. The method of claim 8 wherein the semiconductor layers comprise waveguide cladding material.

10. A method for predicting performance of a quantum cascade laser (QCL) having at least one InP spacer within a laser core, the QCL to provide a continuous wave (CW) output, the method comprising:
    selectively setting a plurality of parameters for the QCL, the plurality of parameters comprising
    a number of the at least one InP spacer,
    a thickness for each InP spacer, a number of stages in the laser core,
    a number of spaced apart active region stacks in the laser core, and
    a dopant concentration value in the laser core, the spaced apart active region stacks comprising outer active region stacks and inner active region stacks, the inner active region stacks having a different number of layers than the outer active region stacks; and
    generating a figure of merit comprising a greatest value for a fundamental mode of operation for the QCL based upon the plurality of parameters.

11. The method of claim 10 wherein the QCL comprises one of a buried heterostructure (BH) configuration or a ridge waveguide (RWG) configuration.

12. The method of claim 10 further comprising determining a threshold current value during the CW output based upon a threshold current value during pulsed output and an ambient temperature value.

13. The method of claim 10 wherein the plurality of parameters comprises a transparency current value, loss values, a differential gain value, an injection efficiency value, and a sub-linearity of a pulsed power versus current density value.

14. The method of claim 10 wherein the figure of merit is based upon a confinement factor, a mirror loss, and a waveguide loss.

15. The method of claim 10 predicting a power current density in the QCL.

16. A quantum cascade laser (QCL) comprising:
    a substrate;
    a laser core over said substrate and comprising
       a plurality of active region stacks comprising outer active region stacks and inner active region stacks, the inner active region stacks having a different number of layers than the outer active region stacks, each region stack comprising a plurality of active region layers, and
       at least one InP spacer between respective ones of said plurality of active region stacks; and
    semiconductor layers comprising waveguide cladding material adjacent to said laser core and guiding a laser mode into said laser core.

17. The QCL of claim 16 wherein said at least one InP spacer comprises a plurality of InP spacers.

18. The QCL of claim 16 further comprising a highly reflective (HR) coatings on a back facet.

19. The QCL of claim 16 wherein said laser core has a width greater than 20 μm.

20. The QCL of claim 16 wherein said plurality of active region stacks comprises varying layer thickness between different active region stacks.

* * * * *